(12) United States Patent
Giusti et al.

(10) Patent No.: US 11,818,957 B2
(45) Date of Patent: Nov. 14, 2023

(54) PIEZOELECTRICALLY ACTUATED MEMS OPTICAL DEVICE HAVING A PROTECTED CHAMBER AND MANUFACTURING PROCESS THEREOF

(71) Applicant: STMICROELECTRONICS S.r.l., Agrate Brianza (IT)

(72) Inventors: Domenico Giusti, Caponago (IT); Irene Martini, Bergamo (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 786 days.

(21) Appl. No.: 16/746,676

(22) Filed: Jan. 17, 2020

(65) Prior Publication Data

US 2020/0235280 A1  Jul. 23, 2020

(30) Foreign Application Priority Data

Jan. 21, 2019  (IT) .................. 102019000000885

(51) Int. Cl.
*H01L 41/09* (2006.01)
*H10N 30/20* (2023.01)

(52) U.S. Cl.
CPC .... *H10N 30/2047* (2023.02); *B81B 2201/032* (2013.01); *B81B 2203/0127* (2013.01)

(58) Field of Classification Search
CPC .......................... H10N 30/2047; H01L 41/0973
See application file for complete search history.

(56) References Cited

U.S. PATENT DOCUMENTS

| 8,633,553 | B2 | 1/2014 | Ferrera et al. |
| 2003/0001931 | A1 | 1/2003 | Isono |
| 2006/0098059 | A1* | 5/2006 | Ohguro ................ H03H 9/587 |
| | | | 257/E27.006 |
| 2011/0115337 | A1 | 5/2011 | Nakamura et al. |
| 2012/0087522 | A1 | 4/2012 | Lee et al. |

(Continued)

FOREIGN PATENT DOCUMENTS

| CN | 103490743 A | 1/2014 |
| CN | 104575485 A | 4/2015 |
| WO | 2018/057982 A1 | 3/2018 |

OTHER PUBLICATIONS

Nicolas et al. "Fabrication and Characterization of a New Varifocal Liquid Lens With Embedded PZT Actuators for High Optical Performances", 2015 28$^{th}$ IEEE International Conference on Micro Electro Mechanical Systems (MEMS), IEEE, Jan. 18, 2015, pp. 65-68.

(Continued)

*Primary Examiner* — Bryan P Gordon
(74) *Attorney, Agent, or Firm* — SEED IP LAW GROUP LLP

(57) ABSTRACT

A MEMS optical device having an optically active portion and an actuation portion adjacent to each other. The MEMS optical device includes a body, a piezoelectric actuator, and a cap. The body is formed by a substrate, housing a cavity containing a fluid and by a deformable region fixed to the substrate, suspended over the cavity and forming a membrane. The piezoelectric actuator extends on the deformable region at the actuation portion and is protected by the cap, which is coupled to the body at the actuation portion and defines a chamber that houses the piezoelectric actuator.

20 Claims, 10 Drawing Sheets

(56) References Cited

U.S. PATENT DOCUMENTS

| | | |
|---|---|---|
| 2013/0057963 A1 | 3/2013 | Ono |
| 2014/0313264 A1 | 10/2014 | Cattaneo et al. |
| 2015/0123222 A1* | 5/2015 | Bilic .................. B81C 1/00896 |
| | | 257/418 |
| 2017/0173955 A1 | 6/2017 | Mizukami |
| 2017/0182778 A1* | 6/2017 | Cattaneo ................ B41J 2/1629 |
| 2018/0141074 A1 | 5/2018 | Giusti et al. |
| 2018/0215607 A1* | 8/2018 | Giusti ................ H10N 30/2047 |

OTHER PUBLICATIONS

Kim et al., "Thickness dependence of structural and piezoelectric properties of epitaxial Pb($Zr_{o.52}Ti_{o.48}$)O3 films on Si and $SrTiO_3$ substrates," *Applied Physics Letters* 88:142904, 2006. (3 pages).

\* cited by examiner

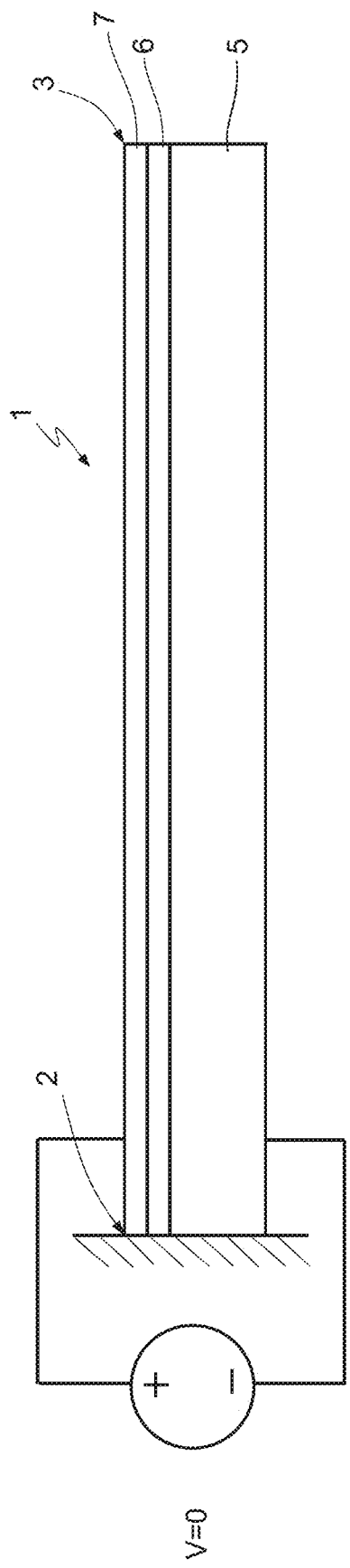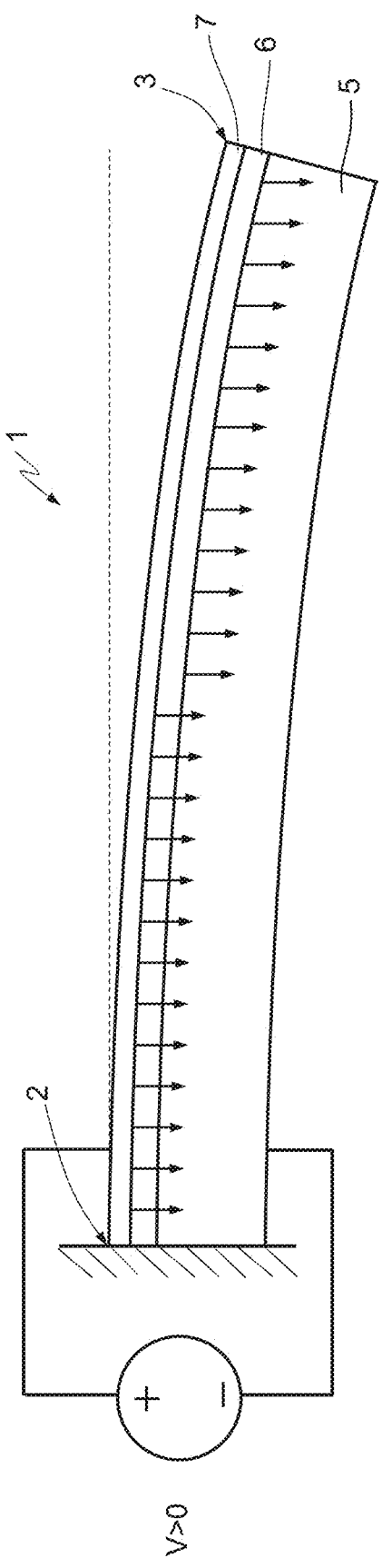
Fig.1A
Fig.1B

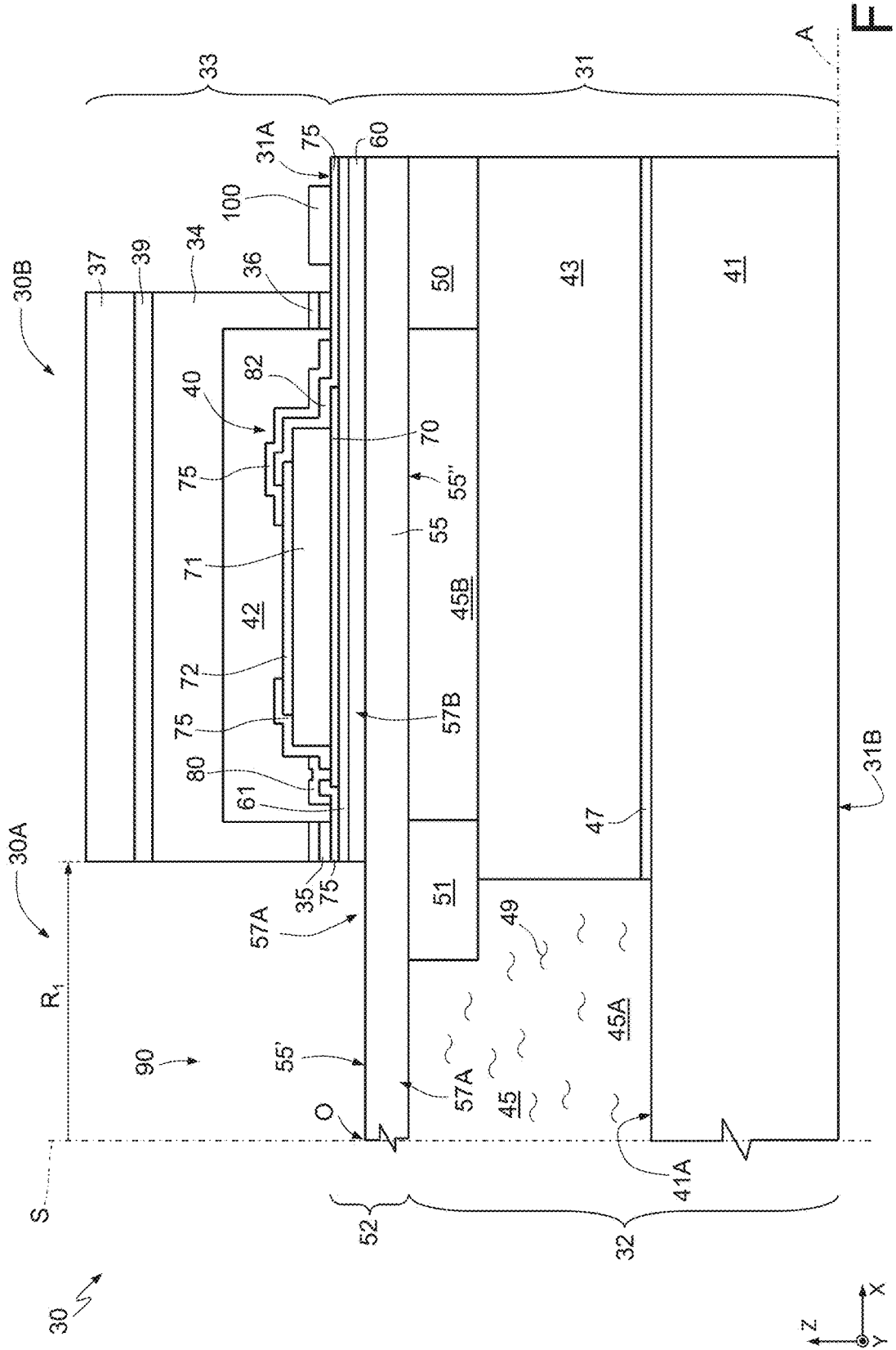

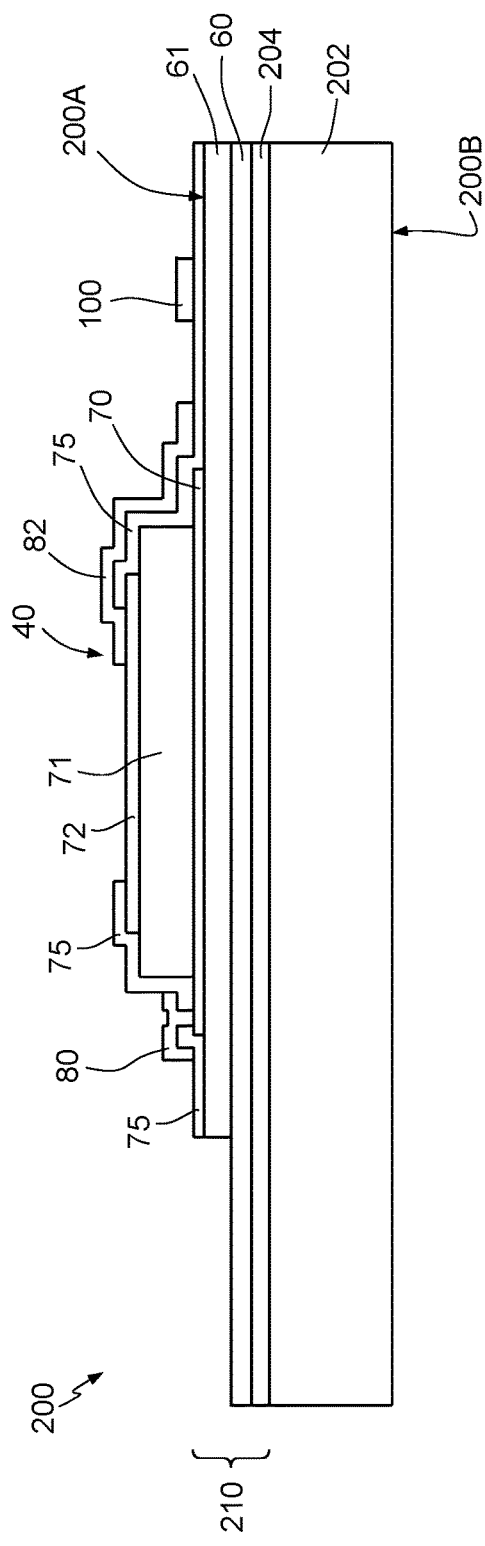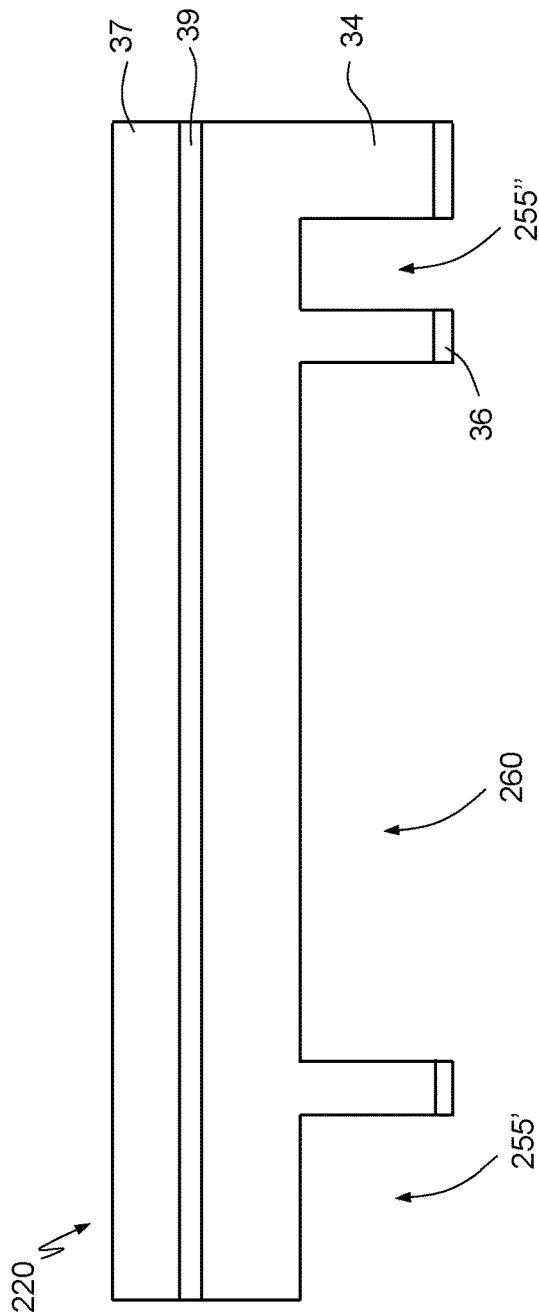

PIEZOELECTRICALLY ACTUATED MEMS OPTICAL DEVICE HAVING A PROTECTED CHAMBER AND MANUFACTURING PROCESS THEREOF

BACKGROUND

Technical Field

The present disclosure relates to a piezoelectrically actuated MEMS (Micro-Electro-Mechanical System) device. In some embodiments, reference is made to piezoelectrically actuated MEMS optical devices hereinafter.

Description of the Related Art

As is suitable, actuators are devices that convert a physical quantity of one type into another of a different type; in some embodiments, the quantity deriving from conversion usually entails some form of movement or mechanical action.

Recently, actuators of micrometric and nanometric dimensions, also referred to as micro-actuators or nano-actuators, which can be obtained with semiconductor technology (the so-called MEMS devices) and hence at very contained costs have been proposed. These micro-actuators and nano-actuators can be used in a variety of devices, in some instances in mobile and portable devices.

Examples of microactuators are valves, switches, pumps, linear and rotary micromotors, linear positioning devices, speakers, and optical devices.

Microactuators basically work according to four physical principles:

- Electrostatic microactuators: they exploit the attraction between conductors charged in an opposite way;
- Thermal microactuators: they exploit the displacement caused by thermal expansion or contraction;
- Piezoelectric microactuators: they exploit the displacement caused by strains and stresses induced by electrical fields; and
- Magnetic microactuators: they exploit the displacement caused by the interaction between different elements having magnetic characteristics, such as permanent magnets, external magnetic fields, magnetisable materials, and conductors of electric current.

Each technology presents advantages and limits in terms of power consumption, movement rapidity, force exerted, movement amplitude, movement profile, simplicity of manufacture, amplitude of the applied electrical signals, strength and sensitivity, which makes use thereof advantageous in certain applications, but not in others, and hence determine the field of use.

Hereinafter, an actuator device obtained with MEMS technology, which operates according to a piezoelectric principle and is able to exploit MEMS thin-film piezo (TFP) technology is considered.

MEMS thin film piezo technology currently uses a unimorphic actuation mode, wherein a structure (for example, a membrane, a beam, or a cantilever beam), usually formed by at least two superimposed layers, undergoes bending as a result of variations in the applied load. In this case, there is a controlled alteration of the strain in one of the layers, referred to as "active layer", which causes a passive strain in the other layer or layers, also referred to as "inactive layers" or "passive layers", with consequent bending of the structure.

The above technique is used for bending the membrane, the beam, or the cantilever in applications where a vertical movement is desired, i.e., a movement in a direction perpendicular to the plane of lie of the structure, such as liquid-jet printing heads, auto-focus systems, micro-pumps, microswitches, and speakers.

For instance, FIGS. 1A and 1B illustrate a cantilever 1 constrained at a first end 2 and free to bend at a second end 3. The cantilever 1 is here formed by a stack of layers including a supporting layer 5, for example made of a semiconductor material of a first type of conductivity, for example P; an active layer 6, for example made of piezoelectric material (PZT); and a top layer 7, for example made of a semiconductor material of a second type of conductivity, for example N.

In the presence of reverse biasing, as illustrated in FIG. 1B, the applied electrical field causes strains in the cantilever 1, which generates a bending of the free end 3 downwards.

An example of embodiment of a piezoelectric MEMS actuator applied to a generic optical device is illustrated in FIGS. 2A and 2B. Here, the optical device, designated by 10, comprises a deformable part or membrane 15, for example, made of glass (e.g., BPSG—BoroPhosphoSilicate Glass), resting, through a lens element 11 (made, for example, of polymer), on a support 12 which is also, for example, made of glass; furthermore, the membrane 15 carries two piezoelectric regions 13 arranged at a distance from each other.

In absence of biasing, FIG. 2A, the membrane 15 and the lens element 11 have planar surfaces and do not modify the path of a light beam 16 that crosses them. When the piezoelectric regions 13 are biased, FIG. 2B, they cause a deformation of the membrane 15. Deformation of the central area of the membrane 15 is transmitted to the lens element 11, the top surface of which curves, thus modifying the focus of the lens element 11 and therefore the path of the light beam 16. It is therefore possible to modify the optical transmission characteristics of the optical device 10.

An example of MEMS devices for optical applications are auto-focus MEMS devices, such as, for example, liquid lenses; in particular liquid lenses are optical devices, the lens of which is formed by a liquid material (for example, apolar liquids, water-based liquids or liquid crystals). Liquid lenses are able to modify in an adaptive way their focus by exploiting various physical principles; in particular, liquid lenses may be based, for example, on the electrostatic actuation principle, on electrowetting, on electrophoresis, or on magnetic or piezoelectric actuation principle.

In particular, piezoelectrically actuated liquid lenses have a structure similar to that of the optical device 10 of FIGS. 2A and 2B. In particular, the lens element 11 is a liquid, for example oil, and the membrane 15 is anchored to the support 12 so as to form a cavity adapted to contain the lens element 11. In use, piezoelectrically actuated liquid lenses operate in a way similar to what is described with reference to FIGS. 2A and 2B.

The piezoelectric actuators illustrated in FIGS. 1A, 1B, 2A, and 2B have the advantage of being fast and compact devices. In fact, unlike other types of actuators, such as capacitive and/or magnetic actuators, they do not require further structures, such as electrodes connected to a reference potential (as in the case of capacitive actuators) or magnets and/or coils (as in the case of magnetic actuators).

However, MEMS optical devices, in particular liquid lenses, of a known type described above have some disadvantages.

In particular, currently, piezoelectric actuators are exposed to the external environment and may therefore be subject to mechanical stresses (such as, for example, impact, mechanical shock, dropping) or of a chemical type (for example, corrosion, oxidation). These stresses may significantly reduce the performances of piezoelectric actuators, as well as of the MEMS optical device itself. Furthermore, piezoelectric actuators (and therefore the MEMS optical device) are less reliable during use.

BRIEF SUMMARY

In some embodiments, the present disclosure provides a MEMS optical device and a manufacturing process thereof.

In some embodiments, the present disclosure provides a piezoelectrically actuated MEMS optical device and a manufacturing process thereof.

BRIEF DESCRIPTION OF THE SEVERAL VIEWS OF THE DRAWINGS

For a better understanding of the present disclosure, a preferred embodiment thereof is now described, purely by way of non-limiting example, with reference to the attached drawings, wherein:

FIGS. 1A and 1B show simplified side views of an example piezoelectric MEMS actuator, respectively, in a rest condition and a condition of deformation;

FIG. 3 is a cross-section view taken along the section line of FIG. 4 of the present MEMS optical device;

FIGS. 6-10, 12, 14, and 15 are cross-section views, similar to that of FIG. 3, of the MEMS optical device of FIGS. 3-5 in successive manufacturing steps;

DETAILED DESCRIPTION

Figure 4:
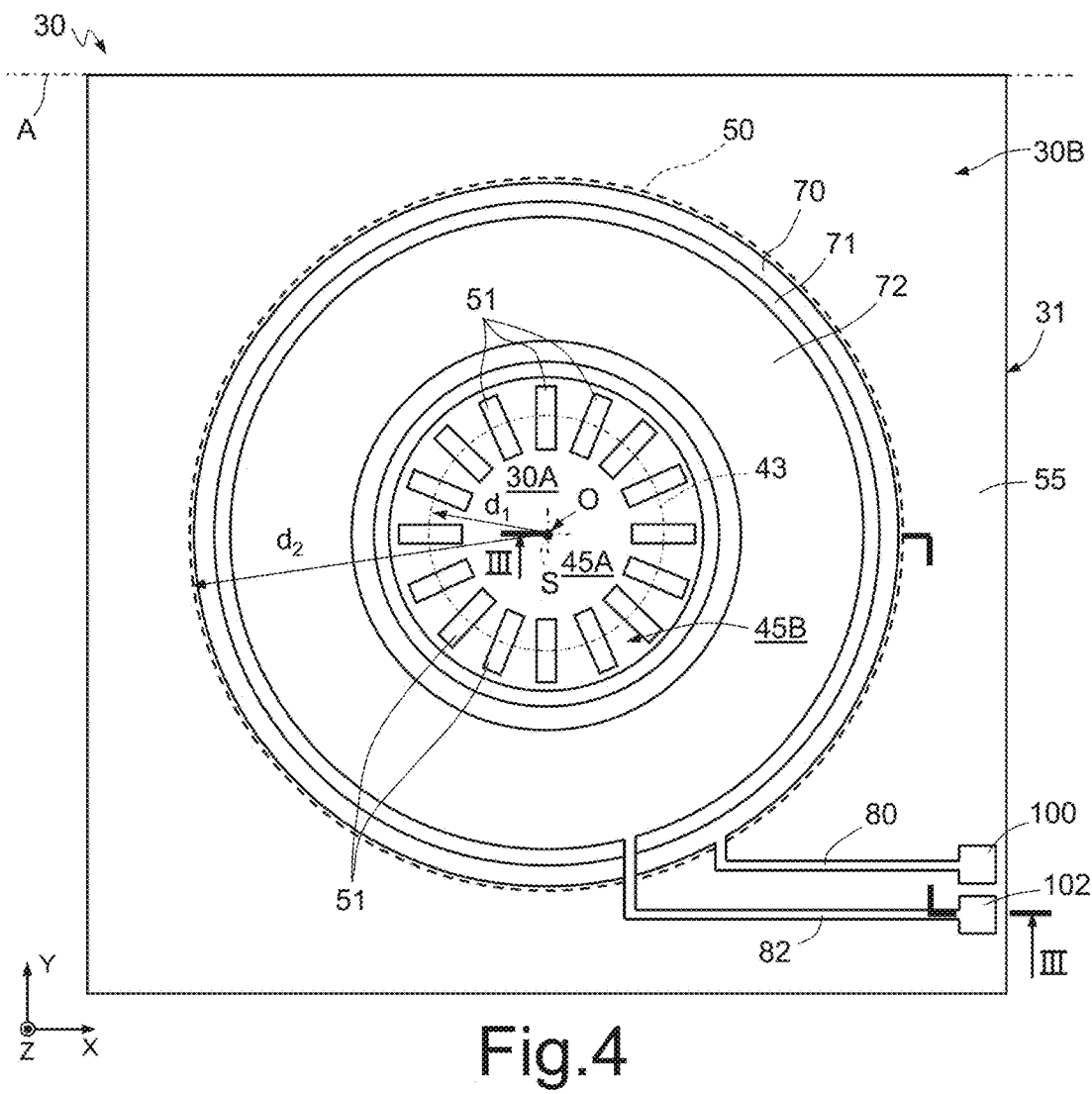
FIG. 4 is a schematic top plan view of the MEMS optical device of FIG. 3 with removed and transparent parts.

FIGS. 3 and 4 are schematic illustrations of a MEMS optical device 30 according to an embodiment; in some embodiments, the MEMS optical device 30 is a liquid lens for auto-focus applications.

The MEMS optical device 30 generally has a parallelepipedal shape, having a quadrangular shape (for example, rectangular) in top plan view (FIG. 4), and has a base defining a plane A parallel to an XY plane of a cartesian reference system XYZ. Furthermore, the MEMS optical device 30 has an symmetry axis S, parallel to a Z axis of the cartesian reference system XYZ, and a centre O, lying on the symmetry axis S.

With reference to FIGS. 3 and 4, the MEMS optical device 30 comprises a central portion 30A and a peripheral portion 30B.

The MEMS optical device 30 comprises, FIG. 3: a body 31, having a first and a second surface 31A, 31B; and a cap 33. The body 31 and the cap 33 are coupled together by means of a first intermediate layer 35 (for example, a layer of benzocyclobutane, BCB, resin, of silicon oxide, $SiO_2$).

The body 31 comprises a substrate 32 and a deformable region 52, extending over the substrate 32 on the peripheral portion 30B.

The substrate 32 houses a cavity 45, adapted to contain a fluid 49 (for example, an immersion liquid, in some embodiments immersion oil, such as the material produced by Solvay under the trade name Fomblin®). The cavity 45 comprises a first and a second cavity portion 45A, 45B, arranged, respectively, at the central portion 30A and at the peripheral portion 30B of the MEMS optical device 30 and in fluidic connection with one another.

In greater detail, the substrate 32 comprises a support 41, a first cavity-definition layer 43 and a second cavity-definition layer 50.

The support 41 is, for example made of a material transparent to the visible light, such as glass (for example, BPSG), and delimits the cavity 45 at the bottom.

The first cavity-definition layer 43 is made of dielectric material (for example, a dry film, such as SINR® manufactured by Shin-Etsu, in some embodiments SINR®-3170), extends over the support 41 on the peripheral portion 30B of the MEMS optical device 30 and has, in top plan view, for example an annular shape with centre O and symmetry axis S, as represented by the dashed line in FIG. 4.

In some embodiments, the first cavity-definition layer 43 has a rectangular outer perimeter, coinciding with that of the MEMS optical device 30, and a circular inner perimeter, having a first diameter $d_1$ and coupled to the support 41 by means of a second intermediate layer 47 (made, for example, of BPSG or BCB resin).

The second cavity-definition layer 50, made of dielectric material (for example, a film that can be deposited via spin-coating), extends over the first cavity-definition layer 43 on the peripheral portion 30B and has, in top plan view, FIG. 4, an annular shape with centre O and symmetry axis S.

In some embodiments, the second cavity-definition layer 50 has a rectangular outer perimeter, coinciding with that of the MEMS optical device 30, and a circular inner perimeter, having a second diameter $d_2$ greater than the first diameter $d_1$ (see also FIG. 4). Consequently, the first cavity-definition layer 43 projects towards the centre O with respect to the second cavity-definition layer 50.

The substrate 32 further comprises a plurality of structural elements 51 (see, in some embodiments, FIG. 4), radially extending straddling the inner perimeter of the first cavity-definition layer 43; in some embodiments, here, each structural element 51 has for example a rectangular shape in top plan view. Furthermore, the structural elements 51 are angularly equidistant from one another so as to form a radial arrangement about the central portion 30A.

The first cavity-definition layer 43 and the second cavity-definition layer 50 delimit, at the sides, the cavity 45 and the structural elements 51 separate the first cavity portion 45A from the second cavity portion 45B. In some embodiments, the first cavity portion 45A is delimited by the first cavity-definition layer 43 and by the structural elements 51 at the sides, at the bottom by the support 41, and at the top by the deformable region 52; the second cavity portion 45B is delimited by the second cavity-definition layer 50 and by the structural elements 51 at the sides, at the bottom by the first cavity-definition layer 43, and at the top by the deformable region 52. In practice, the second cavity portion 45B surrounds the top part of the first cavity portion 45A and is fluidically connected to the latter at the gaps between the structural elements 51.

The deformable region 52 of the body 31 extends over the second cavity-definition layer 50 and the plurality of structural elements 51. In some embodiments, the deformable region 52 extends over the cavity 45 and forms a membrane 57. The membrane 57 comprises a first and a second membrane portion 57A, 57B, arranged at the central portion 30A (over the first cavity portion 45A) and at the peripheral portion 30B of the MEMS optical device 30 (over the second cavity portion 45B) respectively.

The deformable region 52 is formed by a first and by a second flexible layer 55, 60.

In some embodiments, the first flexible layer 55 is made of polymer (for example, cellophane, polyethylene, or patternable silicones, which extends throughout the entire first surface 31A of the body 31 and delimits the cavity 45 at the top. In addition, the first flexible layer 55 comprises a first and a second region 55', 55'', suspended over the first and the second cavity portion 45A, 45B respectively; in some embodiments, the first region 55' forms the first membrane portion 57A.

The second flexible layer 60 is of semiconductor material (for example, epitaxial polysilicon) and extends to the peripheral portion 30B of the MEMS optical device 30 over the second cavity portion 45B; in greater detail, in top plan view, FIG. 4, the second flexible layer 60 has an annular shape with a centre O.

The second region 55'' of the first flexible layer 55 and the second flexible layer 60 form the second membrane portion 57B.

A first dielectric layer 61, made, for example, of $SiO_2$, extends over the second flexible layer 60 and has a shape congruent therewith.

A piezoelectric actuator 40 extends over the first dielectric layer 61 and is formed by a stack of layers. In some embodiments, the stack of layers comprises a first electrode 70; a piezoelectric region 71, for example of PZT (Pb, Zr, $TiO_2$) or AN, extending on the first electrode 70; and a second electrode 72, extending on the piezoelectric region 71.

The piezoelectric actuator 40 further comprises first and second conductive paths 80, 82, extending from the first and from the second electrodes 70, 72 towards a first and a second contact pad 100, 102 for external connection by means of bonding wires (not illustrated) respectively. In some embodiments, the first and the second conductive paths 80, 82 are electrically insulated from each other and from the second flexible layer 60 by means of one or more passivation layers 75 made of dielectric material.

The cap 33 of the MEMS optical device 30 has for example an annular shape with center O and with symmetry axis S in top plan view (not illustrated in FIG. 4 for reasons of clarity). The cap 33, together with the second membrane portion 57B, surrounds an optical opening 90 of a circular shape, with centre O and radius $R_1$. In practice, the optical opening 90 is arranged at the central portion 30A of the MEMS optical device 30. In the illustrated embodiment, the radius $R_1$ is approximately equal to the first diameter $d_1$ of the first cavity portion 45A so that the optical opening 90 is aligned to, and substantially has the same area as, the first cavity portion 45A.

The cap 33 comprises a first and a second structural layer 34, 37, coupled together by means of a third intermediate layer 39 (made, for example, of $SiO_2$). In some embodiments, the first structural layer 34 is made of semiconductor material, such as silicon, and the second structural layer 37 is made of semiconductor material, such as epitaxial polysilicon.

The first structural layer 34 houses a chamber 42, adapted to contain the piezoelectric actuator 40 of the body 31; in some embodiments, the chamber 42 has, in top plan view (not illustrated), an annular shape with centre O and symmetry axis S.

A second dielectric layer 36, made of insulating material (for example, $SiO_2$), is interposed between the first intermediate layer 35 and the first structural layer 34.

The cap 33 enables insulation of the piezoelectric actuator 40 both from the external environment and from the cavity 45, and therefore from the fluid 49, protecting it from possible mechanical and/or chemical stresses.

In use, a potential difference is applied between the first and the second electrodes 70, 72 of the piezoelectric actuator 40 so as to generate a deflection of the second membrane portion 57B in a downwards direction (towards the inside of the cavity 45). Deflection of the second membrane portion 57B causes a compression of the fluid 49 in the second cavity portion 45B and its displacement towards the first cavity portion 45A. Consequently, the liquid in the first cavity portion 45A presses on the first membrane portion 57A, deforming and deflecting it towards the outside of the cavity 45.

Figure 5:
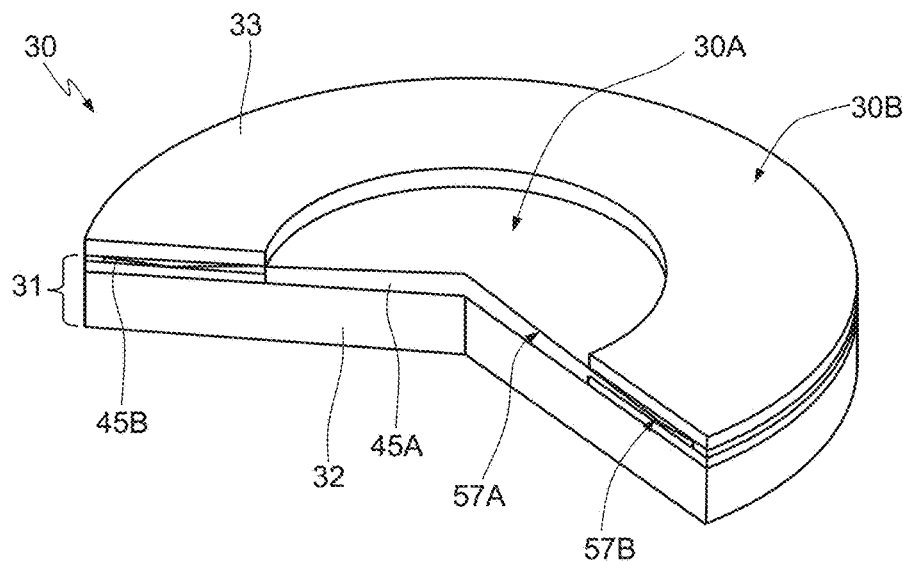
FIG. 5 is a simplified perspective view of the MEMS optical device of FIGS. 3-4 with removed parts.

FIG. 5 shows the MEMS optical device 30 in the deformed condition described above. As may be noted, the second membrane portion 57B is deflected downwards, and the first membrane portion 57A is deflected upwards.

Figure 2A:
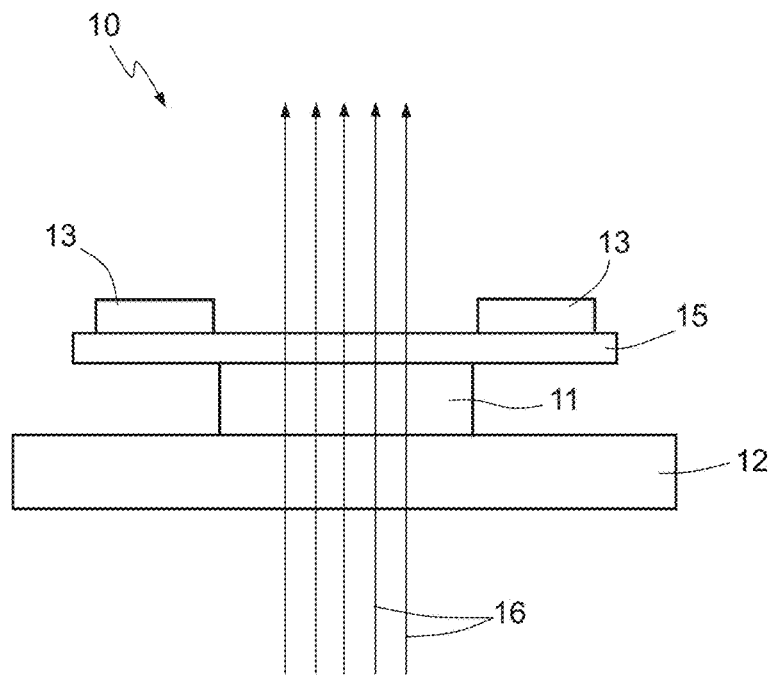
FIGS. 2A and 2B show simplified side views of another example piezoelectric MEMS actuator, used in an optical device in a rest condition and a condition of deformation, respectively.
Figure 2B:
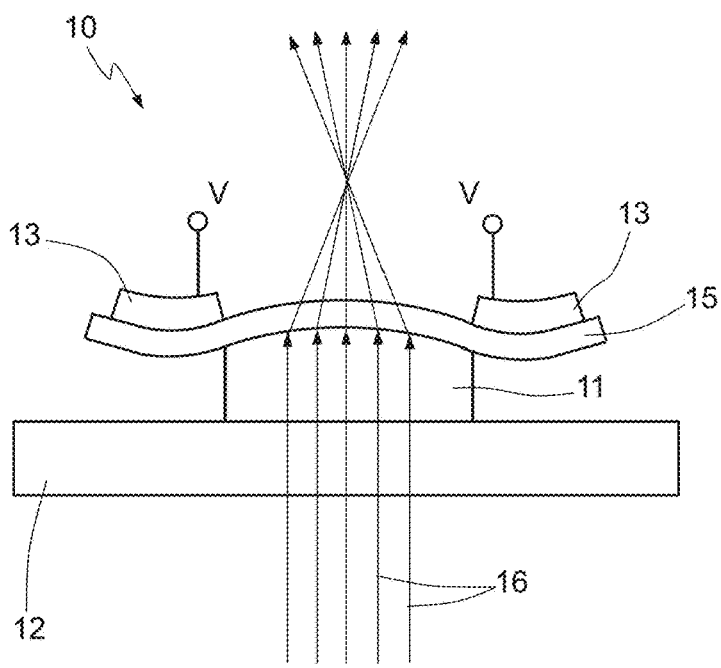

In this way, it is possible to modify the focus of the optical opening 90 of the present MEMS optical device 30, in a way similar to what is described with reference to FIGS. 2A and 2B. In some embodiments, the presence of a greater or smaller amount of fluid 49 in the first cavity portion 45A (and therefore in the central portion 30A of the MEMS optical device 30) enables modification of the properties of the optical opening 90, with consequent modification of the optical path of a light beam (not illustrated) crossing the fluid 49.

The MEMS optical device 30 of FIGS. 3-5 may be manufactured according to the manufacturing steps illustrated in FIGS. 6-17.

In detail, FIG. 6 shows a first wafer 200, having a top surface 200A and a bottom surface 200B. In some embodiments, the first wafer 200 is manufactured according to manufacturing steps similar to those described in U.S. patent US 2014/0313264 A1. Consequently, the manufacturing steps of the first wafer 200, common to the patent referred to above, are briefly described hereinafter.

In some embodiments, the first wafer 200 comprises a supporting substrate 202, made of semiconductor material (for example, silicon); and a stack of membrane layers 210, formed on the supporting substrate 202 and comprising a first insulating layer 204, made, for example, of silicon oxide; the second flexible layer 60 of FIG. 3; and the first dielectric layer 61 of FIG. 3.

In some embodiments, the first insulating layer 204 and the second insulating layer 61 are formed according to suitable growth or deposition techniques, for example thermal growth, and have a thickness ranging, for example, between 0.1 and 2 μm. Furthermore, the second flexible layer 60 is epitaxially grown in a suitable way and has a thickness ranging between 1 and 50 μm.

In alternative embodiments, the stack of membrane layers 210 may be manufactured with other materials which are typically used for MEMS devices, for example $SiO_2$, SiON, or SiN, with a thickness ranging between 0.5 and 10 μm, or by a stack in various combinations of $SiO_2$—Si—SiN.

The first electrode 70, made, for example, of titanium oxide (TiO$_2$), with a thickness ranging between 5 and 50 nm and platinum (Pt), with a thickness ranging between 30 and 300 nm; the piezoelectric region 71, for example with a thickness ranging between 0.5 and 3 µm; and the second electrode 72, made, for example, of platinum (Pt), iridium (Ir), iridium oxide (IrO$_2$), an tungsten and titanium alloy (TiW), or ruthenium (Ru), with a thickness ranging between 30 and 300 nm extend over the top surface 200A of the first wafer 200.

Furthermore FIG. 6 shows the passivation layers 75 covering the first electrode 70, the piezoelectric region 71, the second electrode 72, and the second flexible layer 60, the first and the second conductive paths 80, 82, and the first and the second contact pads 100, 102. In some embodiments, the passivation layers 75 have a thickness ranging, for example, between 10 nm and 1000 nm, and the first and the second conductive paths 80, 82 and the first and the second contact pads 100, 102 are made of conductive material, for example metal (such as aluminum (Al) or gold (Au) eventually in combination with barrier and adhesion layers, such as Ti, TiN, TiW or Ta, TaN).

A second wafer 220 is manufactured so as to form the cap 33. In some embodiments, the second wafer 220 comprises the first and the second structural layers 34, 37, as well as the second dielectric layer 36.

For instance, the first structural layer 34 has a thickness approximately 400 µm, and the second structural layer 37 has a thickness ranging between approximately 1 µm and approximately 20 µm. In some embodiments, the second structural layer 37 is approximately 4 µm.

Furthermore, the second wafer 220 has a first and a second trench 255', 255", as well as a recess 260, designed to form the chamber 42. The trenches 255', 255" and the recess 260 are obtained by means of suitable etching techniques by selectively removing portions of the second dielectric layer 36 and of the first structural layer 34, in a single etching step, or in successive etching steps. The trenches 255', 255" have a depth ranging, for example, between 50 and 300 µm.

Figure 8:
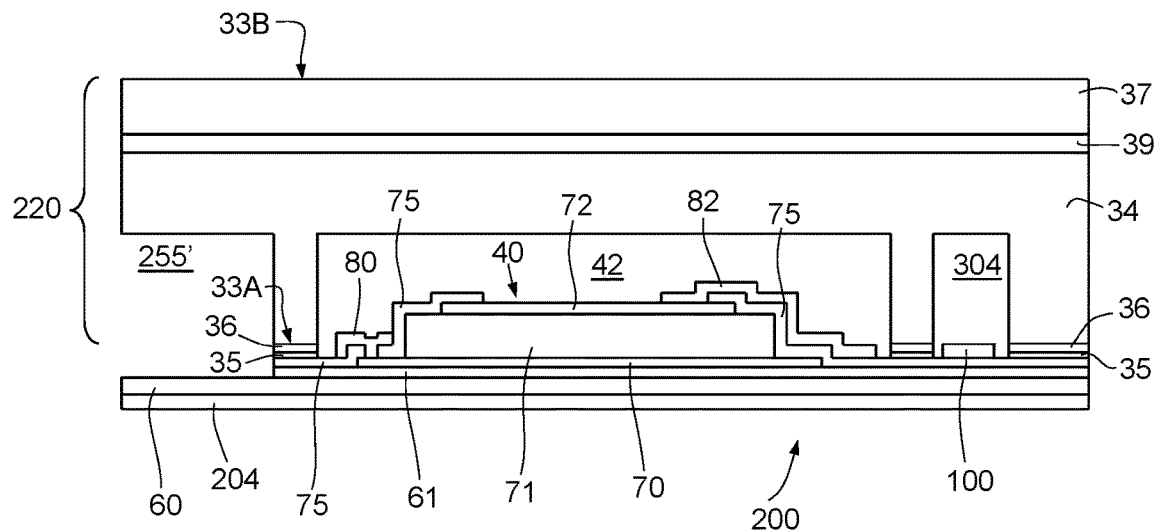

Next, FIG. 8, the first and the second wafers 200, 220 are coupled by means of the first intermediate layer 35 so that the recess 260 surrounds the piezoelectric actuator 40 formed on the top surface 200A of the first wafer 200, thus forming the chamber 42. Furthermore, as a result of the gluing step, the second trench 255" houses the first and the second contact pads 100, 102 (the latter not being visible), thus forming a contact-containment chamber 304.

Next, a grinding step is carried out on the supporting substrate 202 starting from the bottom surface 200B of the first wafer 200 so as to reduce the thickness of the supporting substrate 202, for example, down to 20 µm. Then, a step of silicon anisotropic etching is carried out so as to completely remove the residue of the supporting substrate 202. Thanks to the fact that reduction in the thickness of the first wafer 200 is carried after the step of coupling between the first and the second wafers 200, 220, it is not particularly critical or difficult; moreover, the structures (piezoelectric actuator 40 and contact pads 100, 102) are protected in the chamber 42 and in the contact-containment chamber 304.

Figure 9:
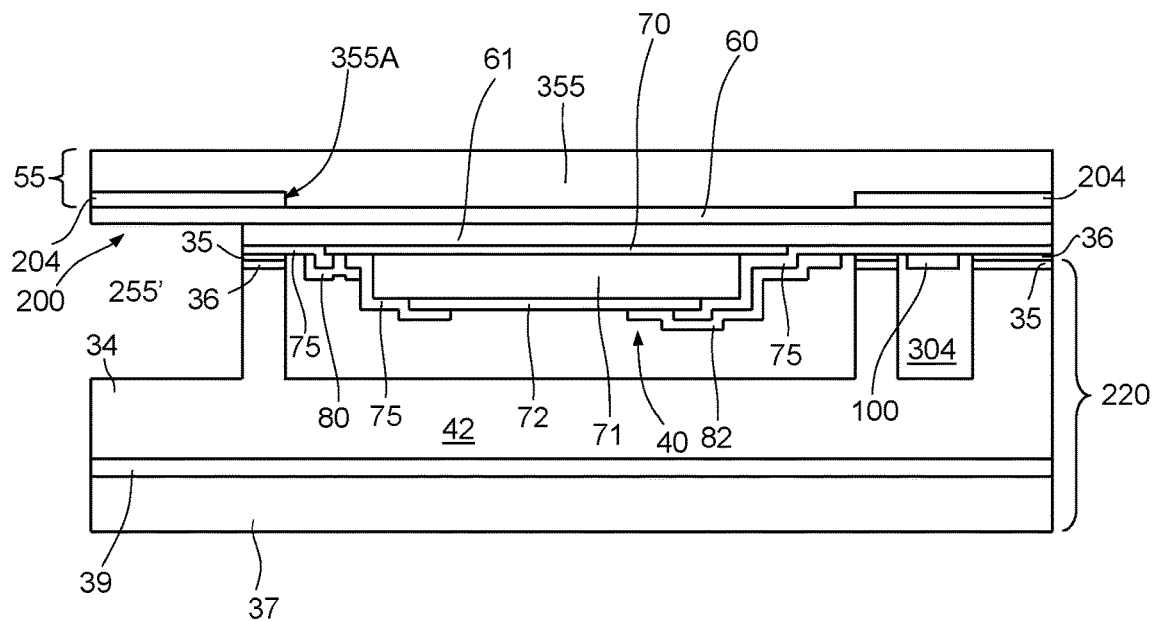

Next, FIG. 9, the structure of FIG. 8 is overturned and subjected to a further step of definition of a suitable type, for example, a lithographic step; in some embodiments, the first insulating layer 204 is patterned so as to form an opening 355A, exposing the second flexible layer 60 at least in part.

Then, a membrane layer 355 of photopatternable spin-on silicone is deposited using, for example, suitable deposition techniques for a thickness, for example, ranging between 5 and 50 µm. The membrane layer 355 and the first insulating layer 204 are designed to form the first flexible layer 55 of FIG. 3.

Figure 10:
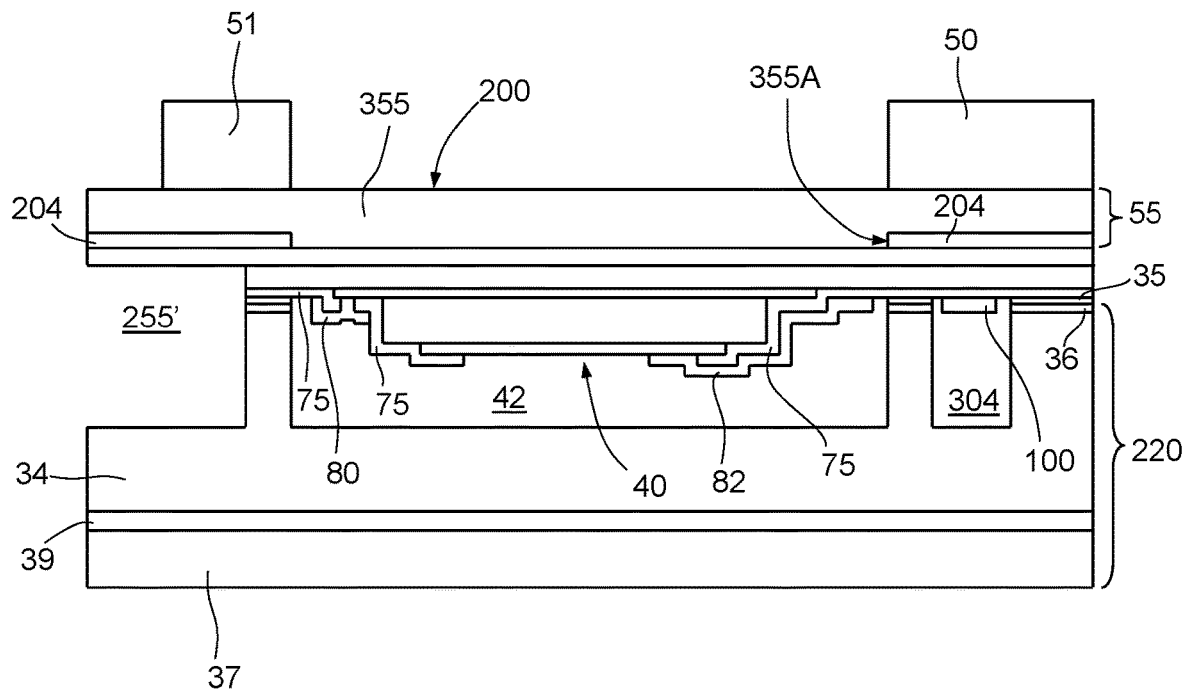
Figure 11:
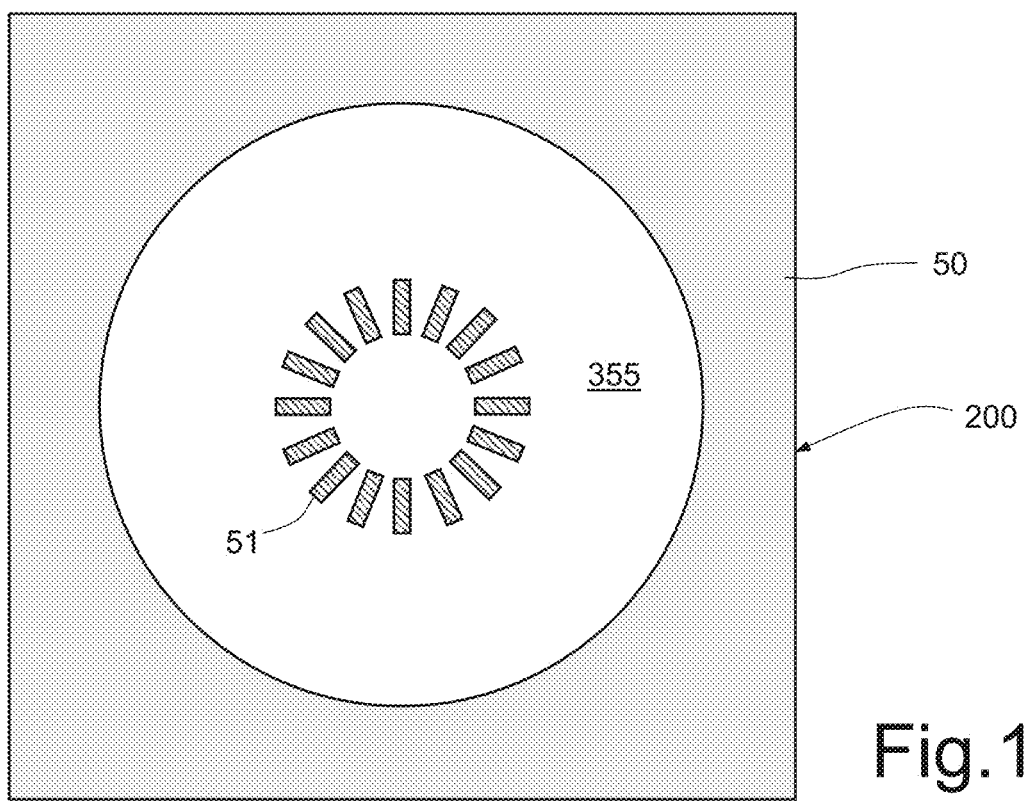
FIGS. 11 and 13 are top plan views of the present MEMS optical device in the manufacturing steps of FIGS. 11 and 12, respectively.

Next, FIG. 10, the second cavity-definition layer 50 and the structural elements 51 of FIGS. 3 and 4 are formed, as illustrated also schematically in the top plan view of FIG. 11. For this purpose, a layer of dielectric material in liquid or sol-gel is deposited and defined using suitable deposition techniques, such as, for example, spin-coating.

Figure 12:
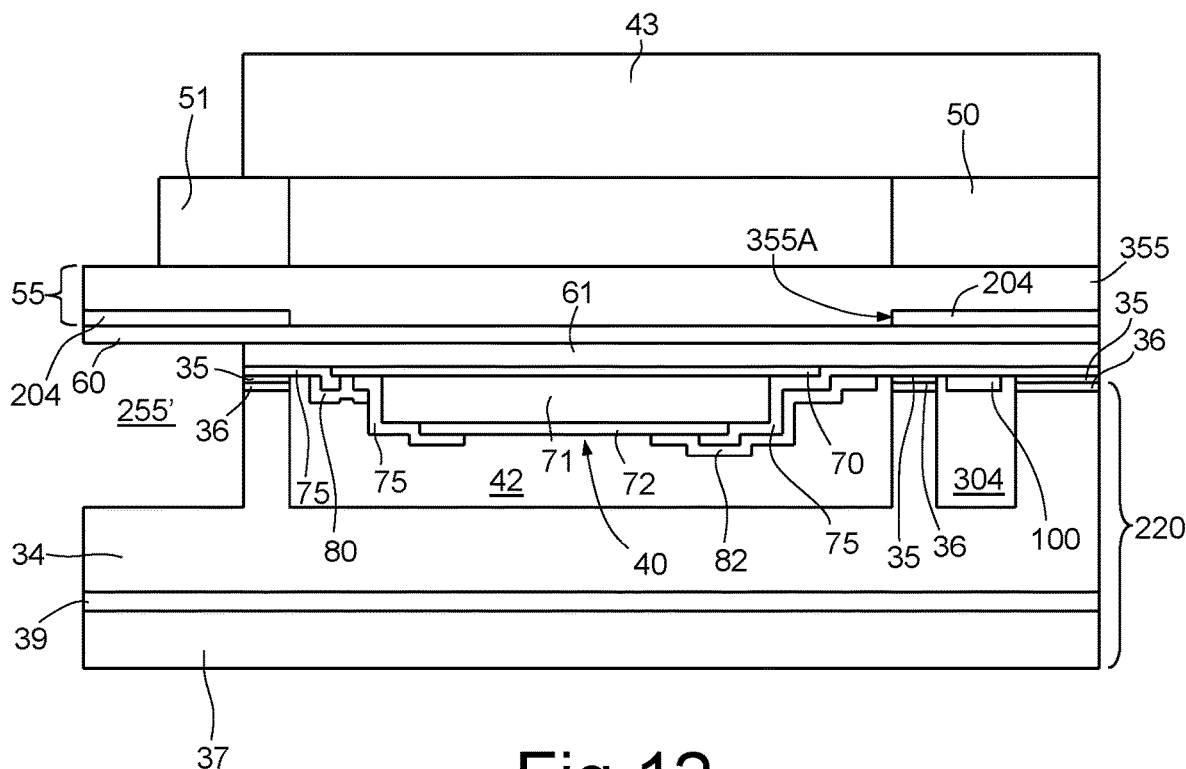
Figure 13:
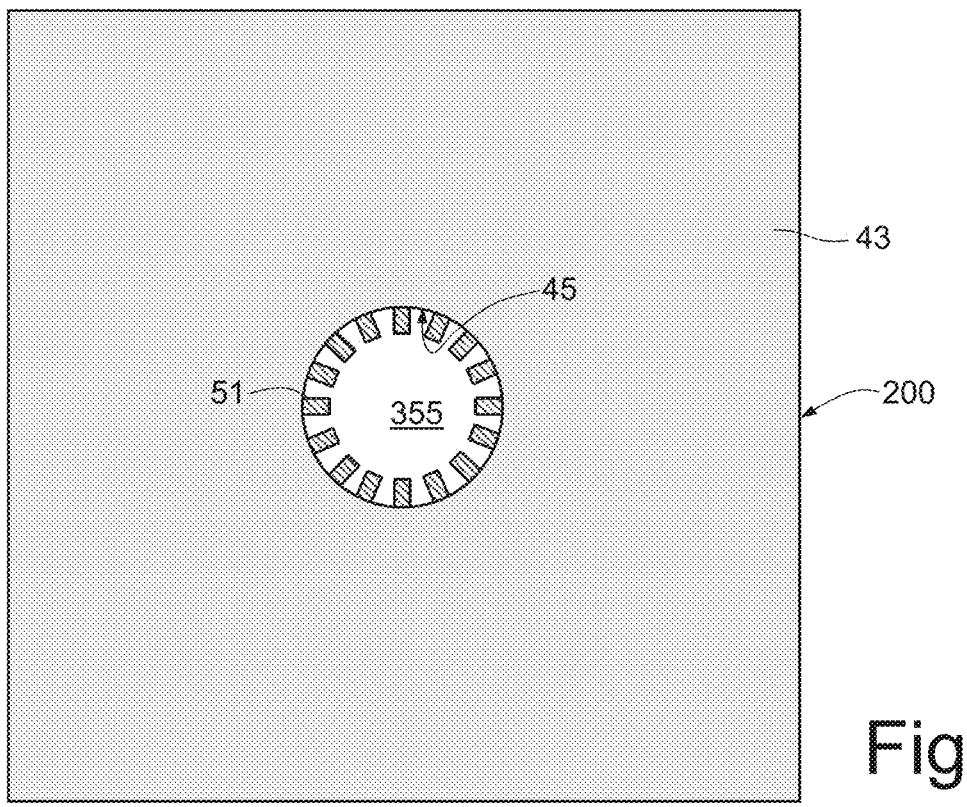

Then, FIGS. 12 and 13, the first cavity-definition layer 43 of FIG. 3 is obtained, using suitable deposition techniques, for example, lamination, and photolithographic definition. In this step, the cavity 45 of FIGS. 3-5 is also formed and is subsequently filled with the fluid 49.

Figure 14:
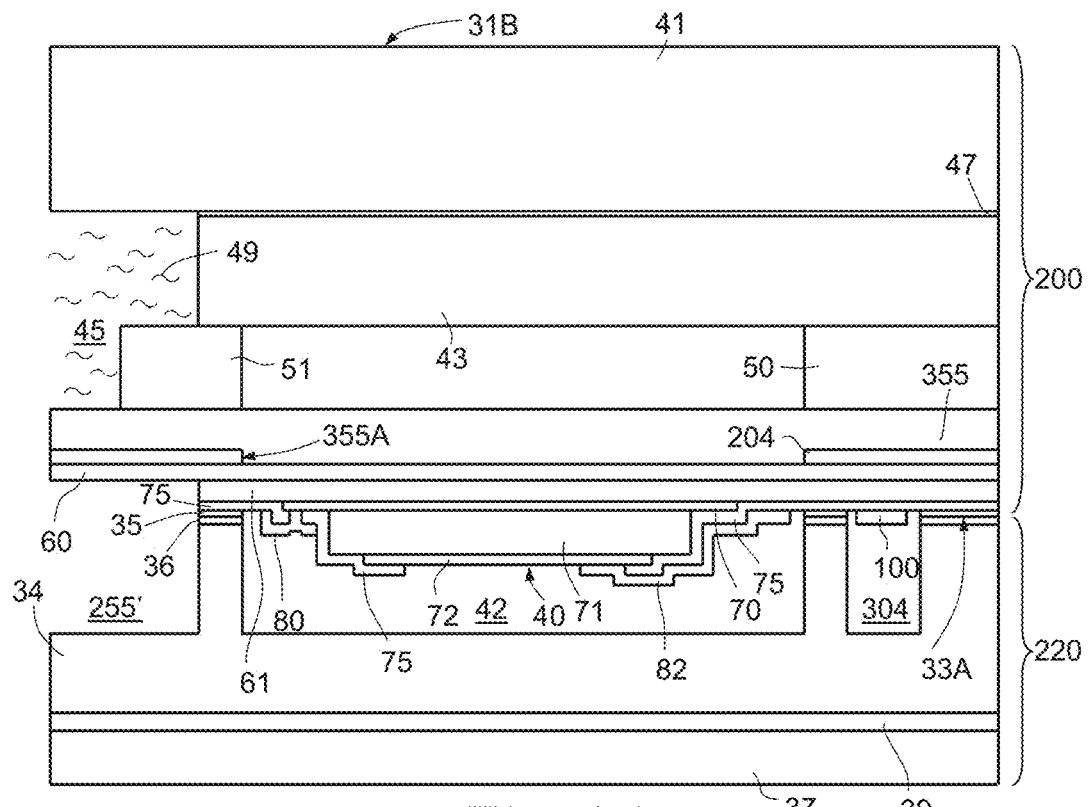

Next, FIG. 14, the support 41 is coupled (in some embodiments, glued) to the first cavity-definition layer 43 via the second intermediate layer 47 to form the body 31.

Figure 15:
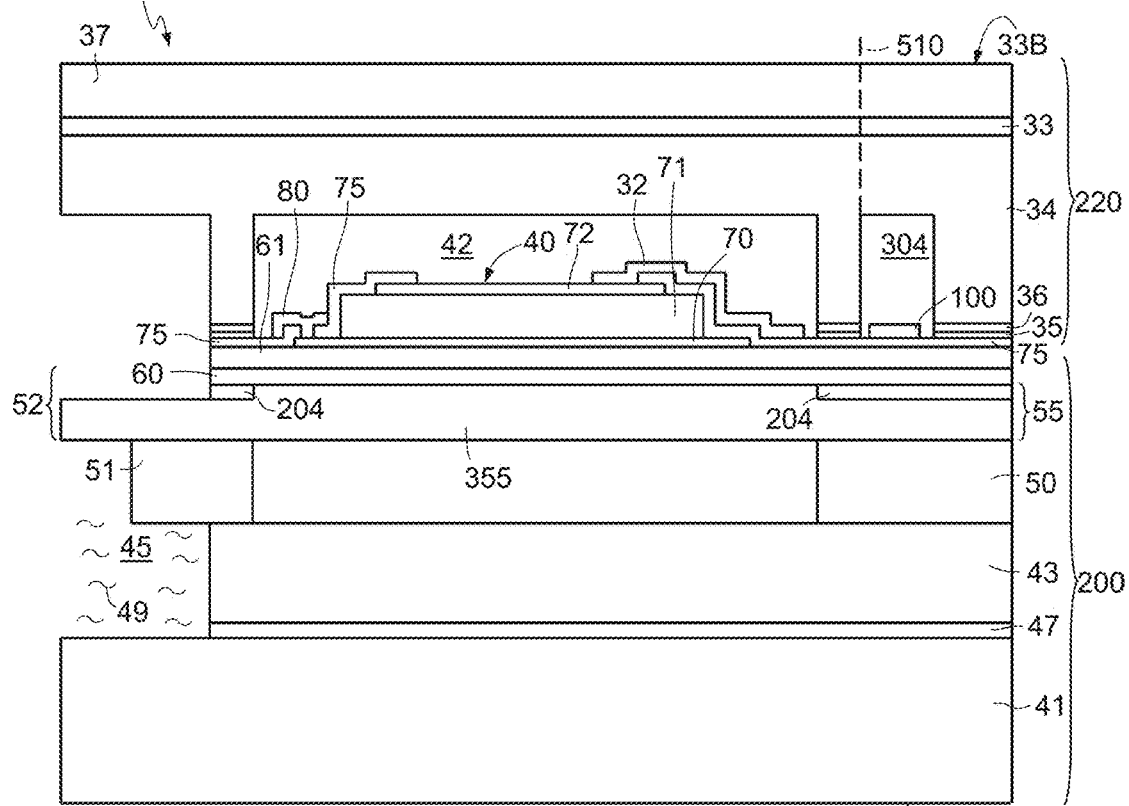

Then, FIG. 15, the second structural layer 37 is thinned out, for example using suitable grinding techniques, so as to reduce the thickness, for example, down to 150 µm. Next, using a mask layer (not illustrated) and suitable photolithographic and etching techniques, the thinned out second structural layer 37, the third intermediate layer 39, and the first structural layer 34 are etched. For instance, anisotropic etching such as DRIE (Deep Reactive Ion Etching) is initially performed, until the second flexible layer 60 is reached, and wet etching of the latter is then carried out, thus leaving the membrane layer 355 made of polymeric material exposed. At the end of the manufacturing step described above, the optical opening 90 is formed.

Finally, a step of partial sawing of the sole second wafer 220, along a cutting line 510 illustrated dashed in FIG. 15, enables removal of an edge portion of the second wafer 220 at the contact pads 100, 102, so as to render them accessible from outside for a subsequent wire-bonding operation.

Before or after the partial-sawing step, the first wafer 200 is also sawed so as to form the MEMS optical device 30 of FIGS. 3 to 5.

Figure 16:
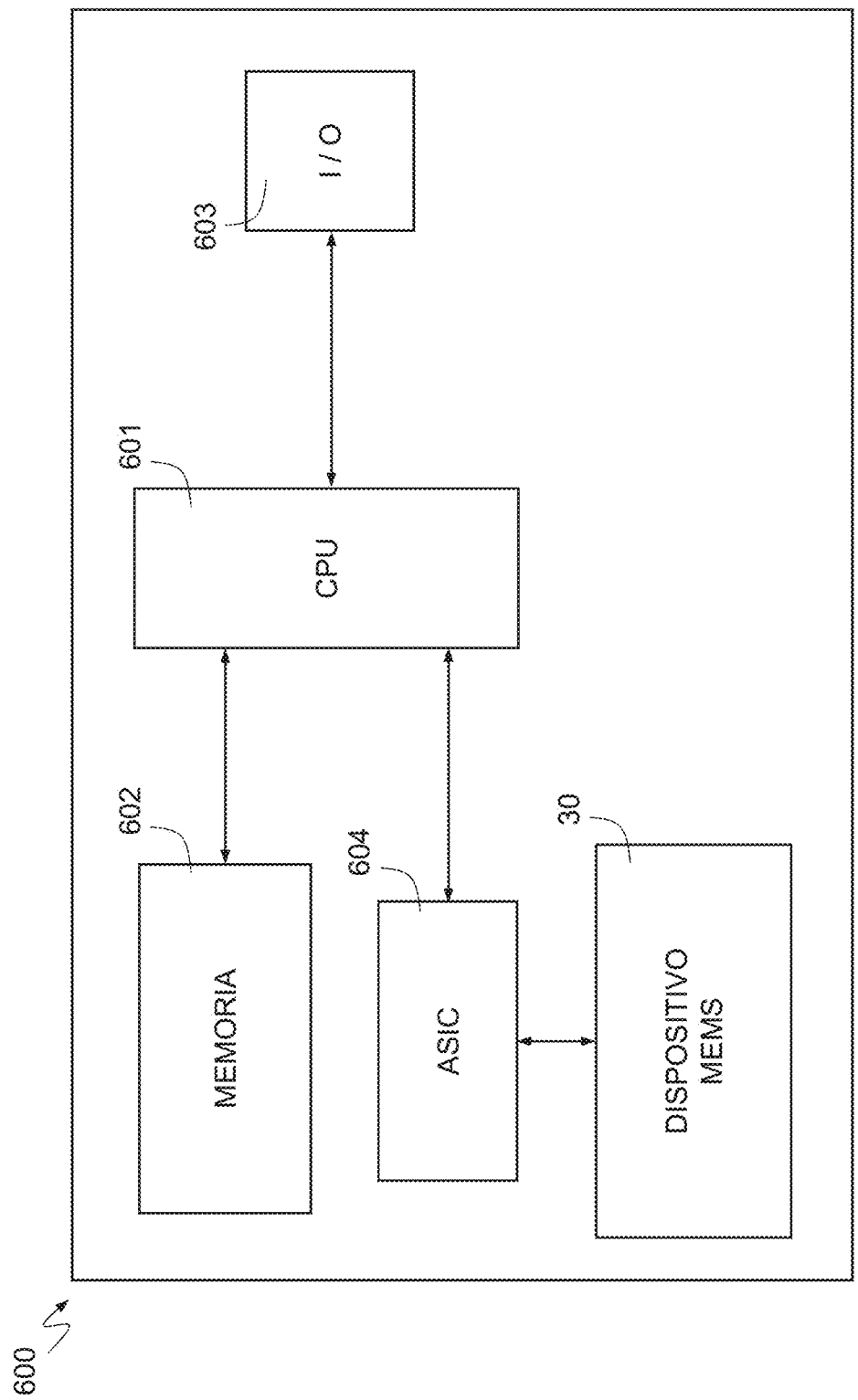
FIG. 16 shows a block diagram of an electronic apparatus including the MEMS optical device of FIGS. 3 to 5.

FIG. 16 shows an electronic device 600 that uses the MEMS optical device 30 of FIGS. 3-5.

The electronic device 600 comprises, in addition to the MEMS device 30, a microprocessor (CPU) 601, a memory block 602, connected to the microprocessor 601, and an input/output interface 603, for example a keypad and/or a display, which is also connected to the microprocessor 601. An ASIC 604 may be integrated in the MEMS device 30 or arranged outside the MEMS device 30 and operatively coupled thereto.

The MEMS device 30 communicates with the microprocessor 701 via the ASIC 604.

The electronic device 600 is, for example, a mobile communication device, such as a mobile phone or smartphone, a PDA, a computer, a smartwatch, but may also be a voice recorder, an audio-file reader with voice-recording capacity, a console for video games, and the like.

The present MEMS optical device and the manufacturing method thereof present various advantages.

In some embodiments, the chamber 42 of the second wafer 220 enables isolation of the piezoelectric actuator 40 both from the external environment and from the cavity 45 (and, therefore, from the fluid 49) so as to protect it from possible external mechanical and/or chemical stresses. Consequently, the actuation capacity of the piezoelectric actuator 40, and hence the performance of the MEMS optical device 30, are not affected by external stresses. It is hence reliable even over time.

Moreover, the manufacturing method used for manufacturing the present MEMS optical device 30 is simple and far from costly.

Finally, it is clear that modifications and variations may be made to the MEMS device and to the manufacturing process described and illustrated herein, without departing from the scope of the present disclosure, as defined in the annexed claims.

For instance, the materials used for manufacturing of the MEMS optical device 30 may be different from the ones referred to in the present description.

In addition, the structural elements 51 may have shapes different from those illustrated in FIGS. 4 and 11; for example, they may be shaped like a cross, cylindrical pillars, or semi-arches.

The peripheral portion and the central portion could be swapped round and/or could form an actuation portion and an optical portion of a different shape, according to the desired optical effects.

The various embodiments described above can be combined to provide further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A MEMS optical device, comprising:
a substrate, the substrate housing a first cavity containing a fluid;
a deformable structure coupled to the substrate, the deformable structure includes:
a first portion and a second portion, the first portion of the deformable structure being suspended over the first cavity;
a first flexible layer covering the first cavity and including a first region and a second region, the first region being arranged adjacent to the first cavity, and the first region of the first flexible layer forms a first membrane; and
a second flexible layer over the second region of the first flexible layer, and the second region of the first flexible layer and the second flexible layer form a second membrane;
a piezoelectric actuator over the second portion of the deformable structure, the second region of the flexible layer being arranged adjacent to the piezoelectric actuator; and
a cap coupled to the second portion of the deformable structure and defining a chamber housing the piezoelectric actuator, and
wherein the substrate further includes a second cavity, the second cavity being arranged adjacent to the second region of the first flexible layer, and wherein the first membrane is suspended over the first cavity, and the second membrane is suspended over the second cavity.

2. The device according to claim 1, wherein the first flexible layer is a transparent polymeric material.

3. The device according to claim 1, wherein the second flexible layer is epitaxial polysilicon.

4. The device according to claim 1, wherein the second cavity has an annular shape and surrounds the first cavity.

5. The device according to claim 4, wherein the substrate includes:

a support of transparent material;
a first cavity-definition layer extending over the support and surrounding the first cavity;
a second cavity-definition layer extending at least partially over the first cavity-definition layer and surrounding the second cavity; and
a plurality of structural elements over the first cavity-definition layer and straddling between the first cavity and the second cavity;
wherein the second cavity-definition layer and the structural elements contact the deformable structure.

6. The device according to claim 1, wherein the cap includes a structural layer of semiconductor material.

7. An electronic apparatus, comprising:
a MEMS device;
an ASIC, electrically coupled to the MEMS device;
a memory block;
an input/output interface; and
a microprocessor, electrically coupled to the ASIC, the memory block and the input/output interface
wherein the MEMS device includes:
a first body, the first body housing a first cavity and a second cavity laterally adjacent to one another, the first cavity containing a fluid,
a first flexible layer coupled to the first body, the first flexible layer including a first region covering the first cavity and a second region covering the second cavity,
a piezoelectric actuator over the second region of the first flexible layer, and
a second body over the second region of the first flexible layer and defining a chamber housing the piezoelectric actuator, the first region of the first flexible layer being at least partially exposed from the second body.

8. The electronic apparatus of claim 7, wherein the MEMS device further includes a second flexible layer between the second region of the first flexible layer and the piezoelectric actuator.

9. The electronic apparatus of claim 7, wherein the second cavity surrounds the first cavity.

10. The electronic apparatus of claim 7, wherein the second cavity is shallower than the first cavity.

11. A MEMS optical device, comprising:
a substrate;
a first cavity within the substrate;
a second cavity within the substrate, the second cavity being laterally adjacent to the first cavity;
a fluid contained within the first cavity;
a first flexible layer coupled to the substrate, the first flexible layer including a first region covering the first cavity and a second region covering the second cavity;
a piezoelectric actuator over the second region of the first flexible layer; and
a cap over the second region of the first flexible layer and defining a chamber housing the piezoelectric actuator, the first region of the first flexible layer being at least partially exposed from the cap.

12. The MEMS optical device of claim 11, wherein the first cavity contains a fluid.

13. The MEMS optical device of claim 11, wherein the cap is at a peripheral region of the substrate.

14. The MEMS optical device of claim 11, further comprising a second flexible layer between the first flexible layer and the piezoelectric actuator.

15. The MEMS optical device of claim 14, wherein the cap is on and at least partially overlaps the second flexible layer.

16. The MEMS optical device of claim 11, wherein the cap includes a plurality of layers.

17. The MEMS optical device of claim 11, wherein the first region is a central region and the second region is a peripheral region that extends around the central region.

18. The MEMS optical device of claim 11, further comprising a contact pad laterally adjacent to the cap and the piezoelectric actuator, and the piezoelectric actuator is coupled to the contact pad.

19. The device according to claim 1, wherein:
   the first flexible layer is a transparent polymeric material; and
   the second flexible layer is epitaxial polysilicon.

20. The device of claim 1, further comprising a contact pad laterally adjacent to the cap and the piezoelectric actuator, and the piezoelectric actuator is coupled to the contact pad.

\* \* \* \* \*